(12) United States Patent
Bilhan et al.

(10) Patent No.: US 8,552,900 B1
(45) Date of Patent: Oct. 8, 2013

(54) SYSTEM AND METHOD OF CLOCKING LOW SAMPLE RATE ANALOG TO DIGITAL CONVERTERS WHILE MINIMIZING LINEARITY ERRORS

(75) Inventors: Haydar Bilhan, Dallas, TX (US); Maher Mahmoud Sarraj, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 7 days.

(21) Appl. No.: 13/451,774

(22) Filed: Apr. 20, 2012

(51) Int. Cl.
*H03M 1/38* (2006.01)

(52) U.S. Cl.
USPC ........... 341/161; 380/274; 380/275; 327/146; 327/292; 708/313; 375/267; 375/355; 375/264; 375/340; 375/365; 341/155; 341/162; 341/164

(58) Field of Classification Search
USPC ......... 341/155–165; 327/146, 292; 708/313; 380/275, 274; 375/267, 355, 364, 340, 232, 375/365, 371
See application file for complete search history.

(56) References Cited

U.S. PATENT DOCUMENTS

| 5,784,422 | A | * | 7/1998 | Heermann | 375/355 |
|---|---|---|---|---|---|
| 6,084,924 | A | * | 7/2000 | Melas | 375/340 |
| 6,185,539 | B1 | * | 2/2001 | Kunz et al. | 704/500 |
| 6,891,490 | B2 | * | 5/2005 | Hales | 341/155 |
| 7,515,083 | B2 | * | 4/2009 | Chen et al. | 341/156 |
| 7,541,952 | B1 | * | 6/2009 | Sankaran et al. | 341/118 |
| RE42,878 | E | * | 11/2011 | Chen et al. | 341/156 |
| 2008/0143576 | A1 | * | 6/2008 | Chen et al. | 341/162 |

* cited by examiner

*Primary Examiner* — Lam T Mai
(74) *Attorney, Agent, or Firm* — Robert D. Marshall, Jr.; Wade James Brady, III; Frederick J. Telecky, Jr.

(57) ABSTRACT

A successive approximation register switched capacitor analog to digital converter utilizes a high frequency clock for controlling comparator reset switches and a clock distribution block to operate at lower sample rates. The successive approximation cycles are clocked with the high frequency clock so that the reset switches stay within the leakage limit irrespective of the sample rate but the end of conversion signal is delayed to mimic the slower sample rate.

13 Claims, 7 Drawing Sheets

SYSTEM AND METHOD OF CLOCKING LOW SAMPLE RATE ANALOG TO DIGITAL CONVERTERS WHILE MINIMIZING LINEARITY ERRORS

CROSS-REFERENCE TO RELATED APPLICATIONS

This application is related to U.S. patent application Ser. No. 13/363,471, filed Feb. 1, 2012, entitled "Analog To Digital Converter With Leakage Current Correction Circuit", herein incorporated by reference.

FIELD OF THE INVENTION

The invention generally relates to the field of analog to digital converters and more specifically to systems and methods of clocking a successive approximation register analog to digital converter at low sampling rates while avoiding significant linearity errors induced by leakage current.

BACKGROUND OF THE INVENTION

Reference is now made to FIG. 1 which depicts a general block diagram of a successive approximation analog to digital converter 10. The successive approximation analog to digital converter 10 comprises a sample and hold circuit 12, a comparator 14, a successive approximation register (SAR) 16, and a digital to analog converter (DAC) 18. The sample and hold circuit 12 acquires an analog input voltage $V_{in}$. The comparator 14 compares analog input voltage $V_{in}$ to the analog output voltage of the DAC 18 and outputs a digital signal to the SAR 16 representative of the comparison. The SAR 16 supplies an approximate digital representation of analog input voltage $V_{in}$ to the DAC 18 and the DAC 18 supplies the comparator 14 with the analog voltage equivalent of the digital output of the SAR 16 for comparison with analog input voltage $V_{in}$. The SAR 16 is initialized so that the most significant bit ($D_{MSB}$) is equal to a digital 1. This code is fed into the DAC, which then supplies the analog equivalent of this digital code ($V_{REF}/2$) into the comparator 14 for comparison with the sampled input voltage $V_{in}$ held by the output of sample and hold circuit 12. If the analog input voltage $V_{in}$ exceeds $V_{REF}$ the comparator 14 signals the SAR 16 to set $D_{MSB}$ to 0 otherwise, $D_{MSB}$ remains a 1. Next $D_{MSB-1}$ is set to 1 and the same test is performed by comparator 14. This cycle is repeated with the next bit until every bit in the SAR 16 has been tested down to $D_0$. The resulting output from the SAR 16 at the end of the conversion (EOC) is the digital approximation of the sampled input voltage $V_{in}$ which is finally output by the DAC 18.

Reference is now made to FIG. 2 which depicts a differential input, switched capacitor/resistor DAC 18 for use with a successive approximation analog to digital converter. The switched capacitor DAC 18 comprises an array 20 of individually switched, binary-weighted capacitors 1C-16C in combination with resistor divider array 21 having resistors R1-R128. It is to be understood that the DAC 18 could be implemented entirely with switched capacitors without the resistor divider array 21 without departing from the scope of the present invention. The digitization cycle starts by sampling the differential analog input ($A_{INM}, A_{INP}$) and resetting the sense nodes of comparator 14 to half the analog supply ($AV_{DD}/2$) by switching on comparator input reset switches 22a and 22b. A Person Having Ordinary Skill in the Art (PHOSITA) will readily recognize that only one switch is used for single-ended applications. The reset switches 22a and 22b are turned off during the approximation cycles (12 clock cycles for 12 bit ADC). During this time however, as explained in more detail herein below, switches 22a and 22b are injecting undesirable, voltage dependent leakage current into the input sense nodes of comparator 14 which accumulate enough charge to cause significant linearity errors. The problem is particularly acute at strong CMOS model corners and elevated temperatures when using deep submicron processes.

Reference is now made to FIG. 3 that depicts a typical switch 22 used for reset switches 22a and 22b. Switch 22 comprises a pMOS transistor and nMOS transistor coupled in parallel with their respective source and drain terminals coupled together. The gates of the pMOS and nMOS transistors are controlled in a complementary manner so that both transistors are either on or off. When the voltage on the gate terminal is a logical 1 both the pMOS and nMOS transistor conduct and pass the signal between the analog supply ($A_{VDD}/2$) and an input sense node on comparator 14. When the voltage on the gate terminal is a logical 0, both transistors are turned off forcing a high-impedance condition. In such an arrangement, the pMOS transistor in the switch 22 typically leaks current through the NWELL bulk node. Accordingly, the leakage current degrades the linearity of the analog to digital converter during successive approximation cycles. Moreover, the leakage current is exacerbated when the reset switches 22a and 22b are turned off during the approximation cycles with clock cycles having longer periods (i.e. lower frequency). The reset switches 22a and 22b are optimized to sample the analog input signal into the input sense nodes of comparator 14 at a particular clock rate to limit leakage current for acceptable linearity. If the ADC is operated at a much lower sample rate (by reducing the clock frequency), the leakage of the comparator input reset switches 22a and 22b degrades linearity to unacceptable levels during the successive approximation cycles due to longer clock pulse width. This problem is especially acute at strong CMOS model corners and high temperature when using deep submicron processes.

Reference is now made to FIGS. 4 and 5 which depict typical block and timing diagrams respectively for a prior art clocking system 40 used to switch the switched capacitor DAC 18 and comparator input reset switches 22a and 22b. The clocking system 40 includes a comparator/DAC timing generator 42 and an End Of Conversion (EOC) timing generator 44, both having first inputs coupled to a system clock (CLK) and second inputs coupled to a Start Of Conversion (SOC) signal. When SOC transitions low, reset switches 22a and 22b are opened permitting the differential analog input ($A_{INM}, A_{INP}$) into the input sense nodes of comparator 14 to be sampled.

As can be seen from FIG. 5, comparator/DAC timing generator 42 causes the most significant bit (by way of example, D11) to be sampled during the second full cycle of CLK after the falling edge of SOC. Thereafter, subsequent bits D10, D9 . . . D0 are sampled on successive clock cycles. The EOC timing generator 44 generates an End of Conversion EOC signal between the rising edge of SOC and the falling edge of the least significant bit D0.

It is sometimes desirable to sample at a lower sampling rate, for example, if sampling low frequency signals (e.g. voltage supply monitoring) where high data rate throughput is not desirable. Sampling at a lower rate however causes significant linearity errors with ADCs having comparator input reset switches 22a and 22b optimized for a higher frequency sample rate. By way of example and not limitation, if the optimized sample rate is set to 4 MHz but an effective 66.66 kilo-sample per second (KSPS) sample rate is set using a CLK frequency of 1 MHz (FIG. 5), the comparator input reset switches 22a and 22b (which are optimized for 4 MHz) are sampled with a 1 MHz CLK and exhibit a code error of three least significant bits (LSBs) as depicted in FIG. 5. This of course adversely affects the linearity of the ADC.

BRIEF DESCRIPTION OF THE DRAWINGS

Particular embodiments in accordance with the invention will now be described, by way of example only, and with reference to the accompanying drawings.

DETAILED DESCRIPTION OF EMBODIMENTS
OF THE INVENTION

Before the present invention is described in further detail, it is to be understood that the invention is not limited to the particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limit of that range and any other stated or intervening value in that stated range is encompassed within the invention. The upper and lower limits of these smaller ranges may independently be included in the smaller ranges is also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by a PHOSITA to which this invention belongs. Although any methods and materials similar or equivalent to those described herein can also be used in the practice or testing of the present invention, a limited number of the exemplary methods and materials are described herein.

It must be noted that as used herein and in the appended claims, the singular forms "a", "an", and "the" include plural referents unless the context clearly dictates otherwise.

All publications mentioned herein are incorporated herein by reference to disclose and describe the methods and/or materials in connection with which the publications are cited. The publications discussed herein are provided solely for their disclosure prior to the filing date of the present application. Nothing herein is to be construed as an admission that the present invention is not entitled to antedate such publication by virtue of prior invention. Further, the dates of publication provided may be different from the actual publication dates, which may need to be independently confirmed.

Figure 1:
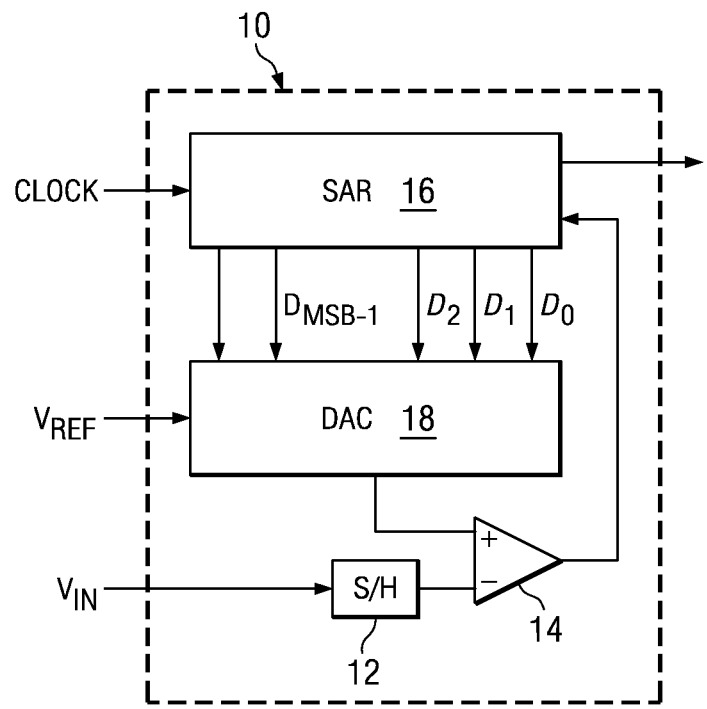
FIG. 1 is a block diagram of a prior art successive approximation analog-to-digital converter.
Figure 3:
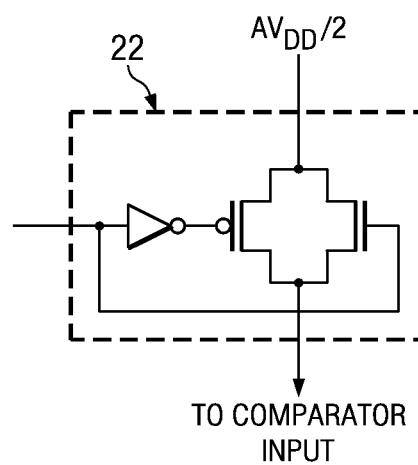
FIG. 3 is a schematic diagram of a prior art switch used to reset comparator inputs depicted in FIG. 2.
Figure 2:
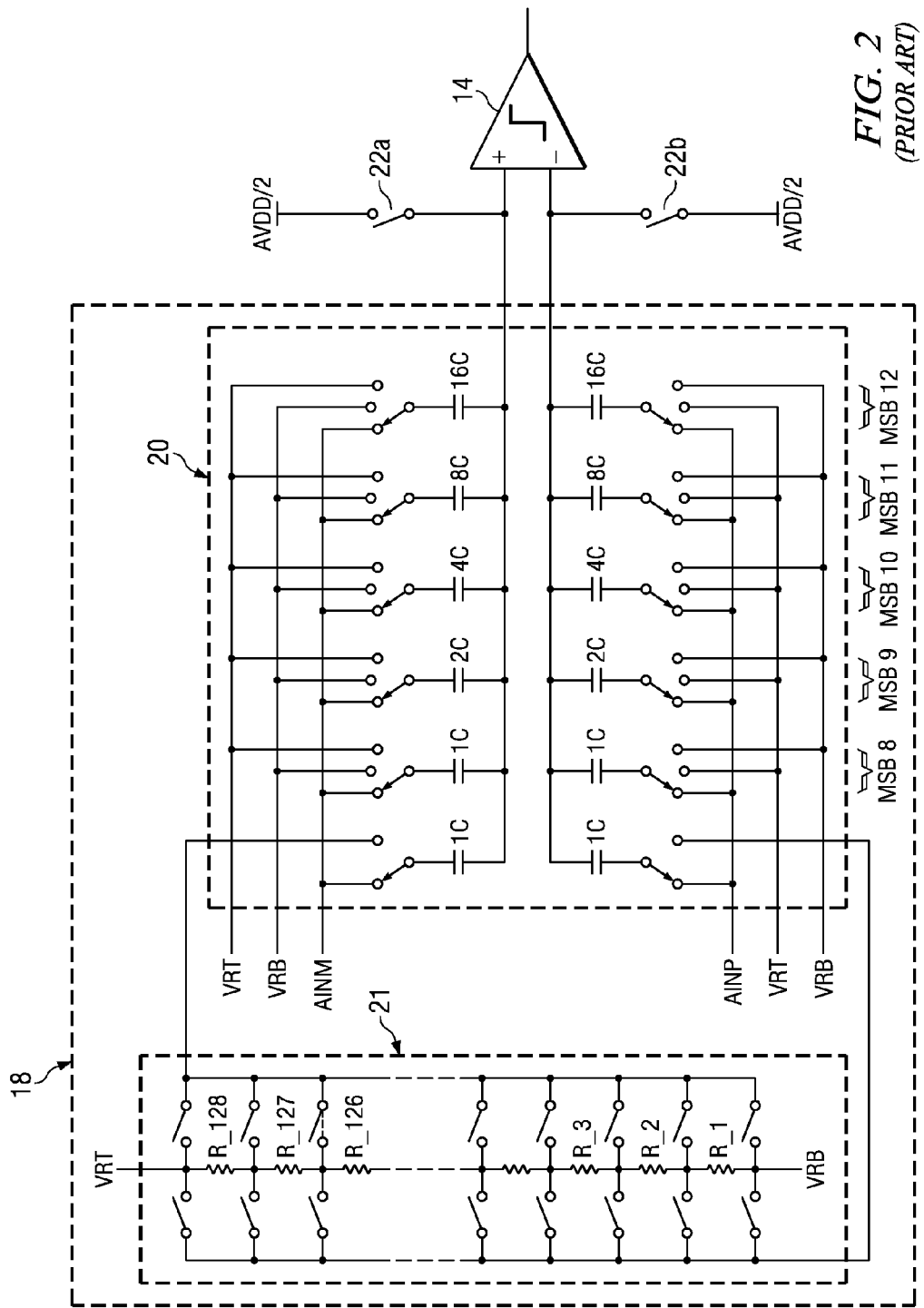
FIG. 2 is a schematic diagram of a prior art successive approximation analog to digital converter employing a switched capacitor DAC.
Figure 4:
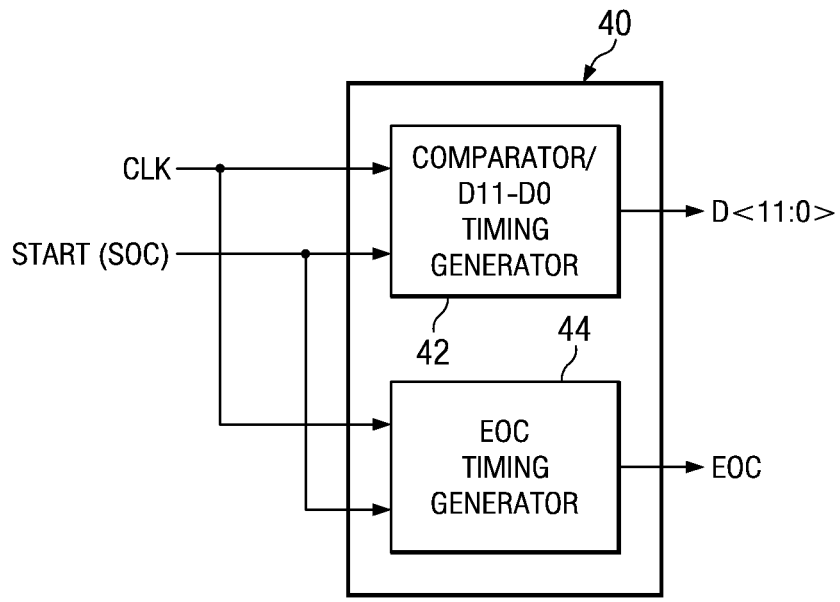
FIG. 4 is a block diagram of a prior art clocking system used to switch the switched capacitor DAC depicted in FIG. 2.
Figure 6:
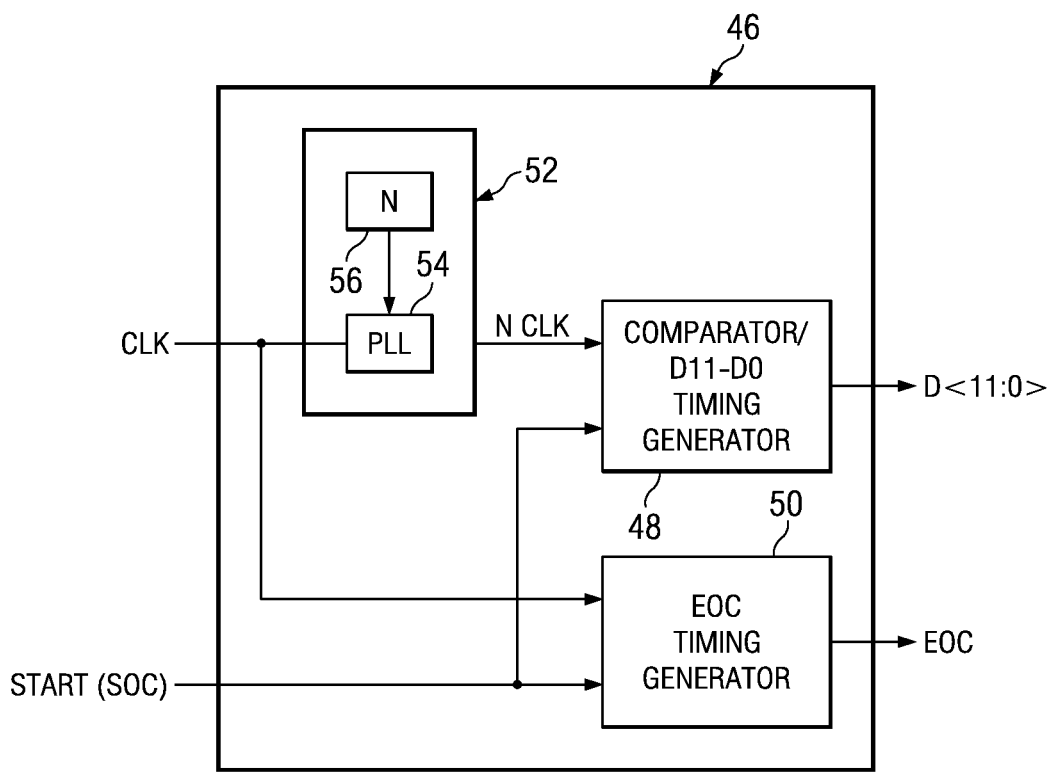
FIG. 6 is a block diagram of a clocking system in accordance with the principles of the present invention.
Figure 7:
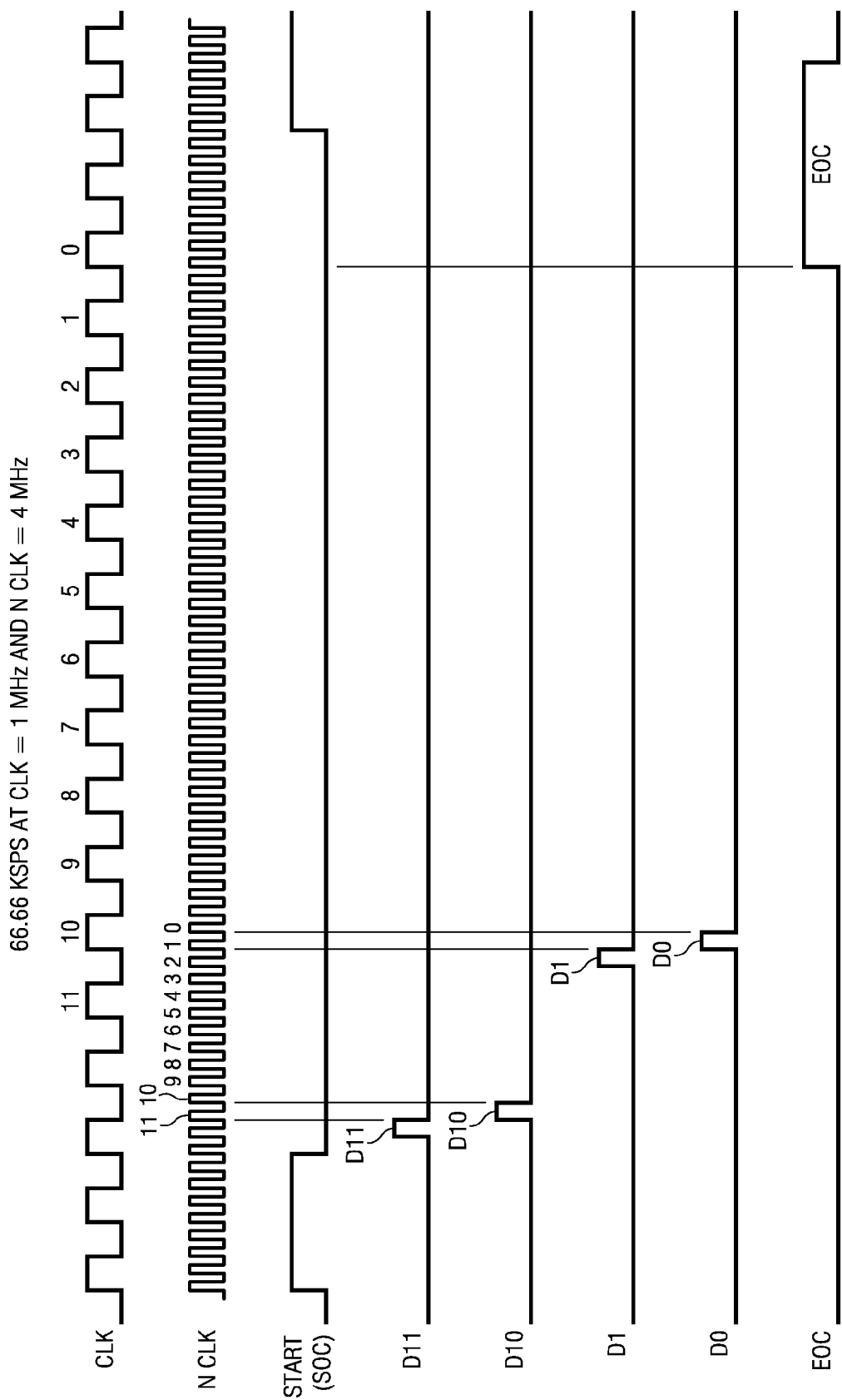
FIG. 7 is a timing diagram for the clocking system depicted in FIG. 6.

Reference is now made to the Figures wherein like numerals indicate corresponding parts throughout the several views. In particular, FIG. 6 depicts a block diagram and FIG. 7 depicts a timing diagram of a clocking system 46 in accordance with the principles of the present invention. The clocking system 46 is used to switch the switched capacitor DAC 18 and comparator input reset switches 22a and 22b in the SAR ADC depicted in FIG. 2. The clocking system 46 includes a comparator/DAC timing generator 48 and an End Of Conversion (EOC) timing generator 50, both having a first set of inputs coupled to a Start Of Conversion (SOC) signal. The End Of Conversion (EOC) timing generator 50 has a second input coupled directly to a system clock (CLK). The system clock (CLK) is coupled to a clock multiplier 52 that has an output (designated as N CLK) coupled to a second input to comparator/DAC timing generator 48. The clock multiplier 52 manifests as a phase locked loop (PLL) 54 with a programmable N counter 56 to adjust the multiplying factor N. A PHOSITA will readily recognize other forms and/or combinations for the clock multiplier 52 without departing from the scope and spirit of the present invention. For example, by way of illustration and not limitation, clock multiplier 52 can be a Delayed Locked Loop (DLL) with phase comparators.

On the falling edge of SOC, reset switches 22a and 22b are opened allowing the differential analog input ($A_{INM}$ $A_{INP}$) to be sampled on the input sense nodes of comparator 14. As further seen from FIG. 7, comparator/DAC timing generator 46 causes the most significant bit (by way of example, D11) to be sampled during the second full cycle of N CLK after the falling edge of SOC. Thereafter, subsequent bits D10, D9 . . . D0 are sampled on successive N CLK clock cycles. The reset switches 22a and 22b which were opened to allow sampling for only three clock cycles CLK (with N=4 for a 12 bit conversion), leaked current only for three CLK cycles (instead of twelve CLK cycles as depicted in the prior art timing of FIG. 5) thus minimally affected linearity.

Figure 5:
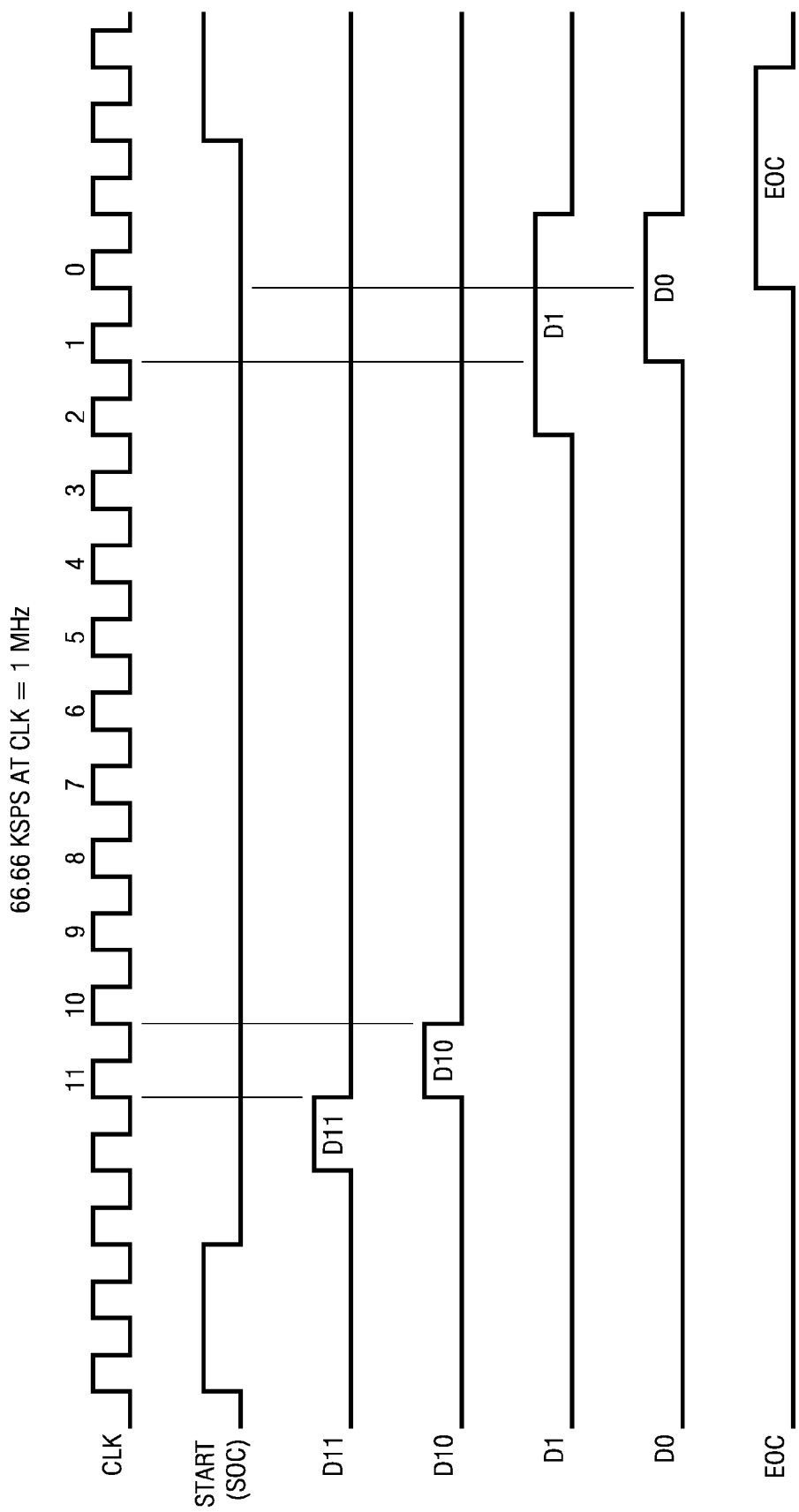
FIG. 5 is a timing diagram for the prior art clocking system depicted in FIG. 4.

However, the EOC timing generator 50 that is clocked by CLK (not N CLK) generates an End of Conversion EOC signal after thirteen CLK cycles, similar to the prior art in FIG. 5. Thus, the clocking system 46 in accordance with the principles of the present invention has the same effective sampling rate of that of 66.66 KSPS for CLK equal to 1 MHz but an actual conversion time for D11-D0 that is N times shorter. Accordingly, the leakage current of reset switches 22a and 22b is N times proportionately lower than that of a straight CLK system.

Figure 8:
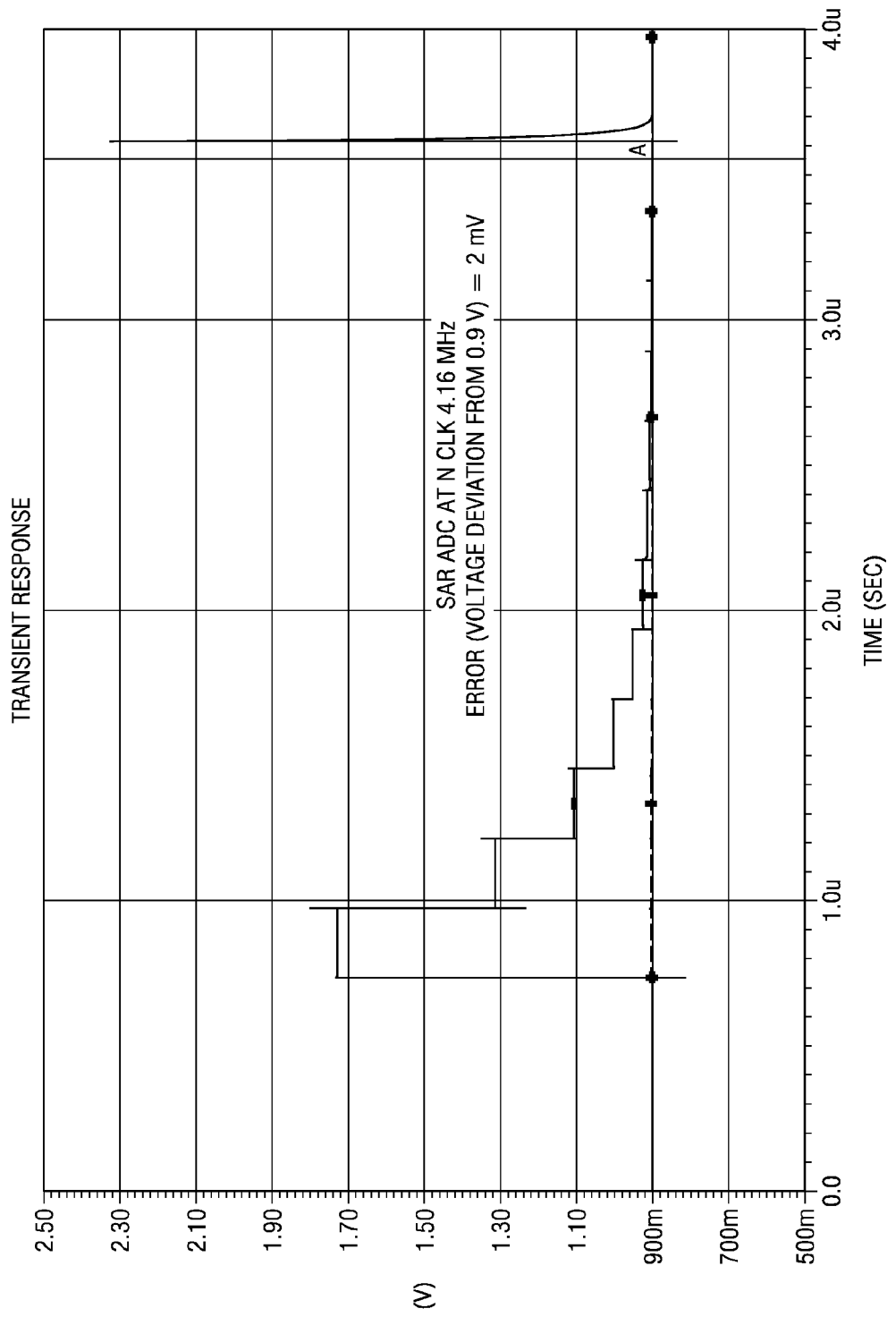
FIG. 8 is a graph depicting the transient response of a switched capacitor, successive approximation, analog to digital converter with a clock rate of 4.16 MHz; and, FIG. 9 is a graph depicting the transient response of a switched capacitor, successive approximation, analog to digital converter with a clock rate of 16.6 MHz.
Figure 9:
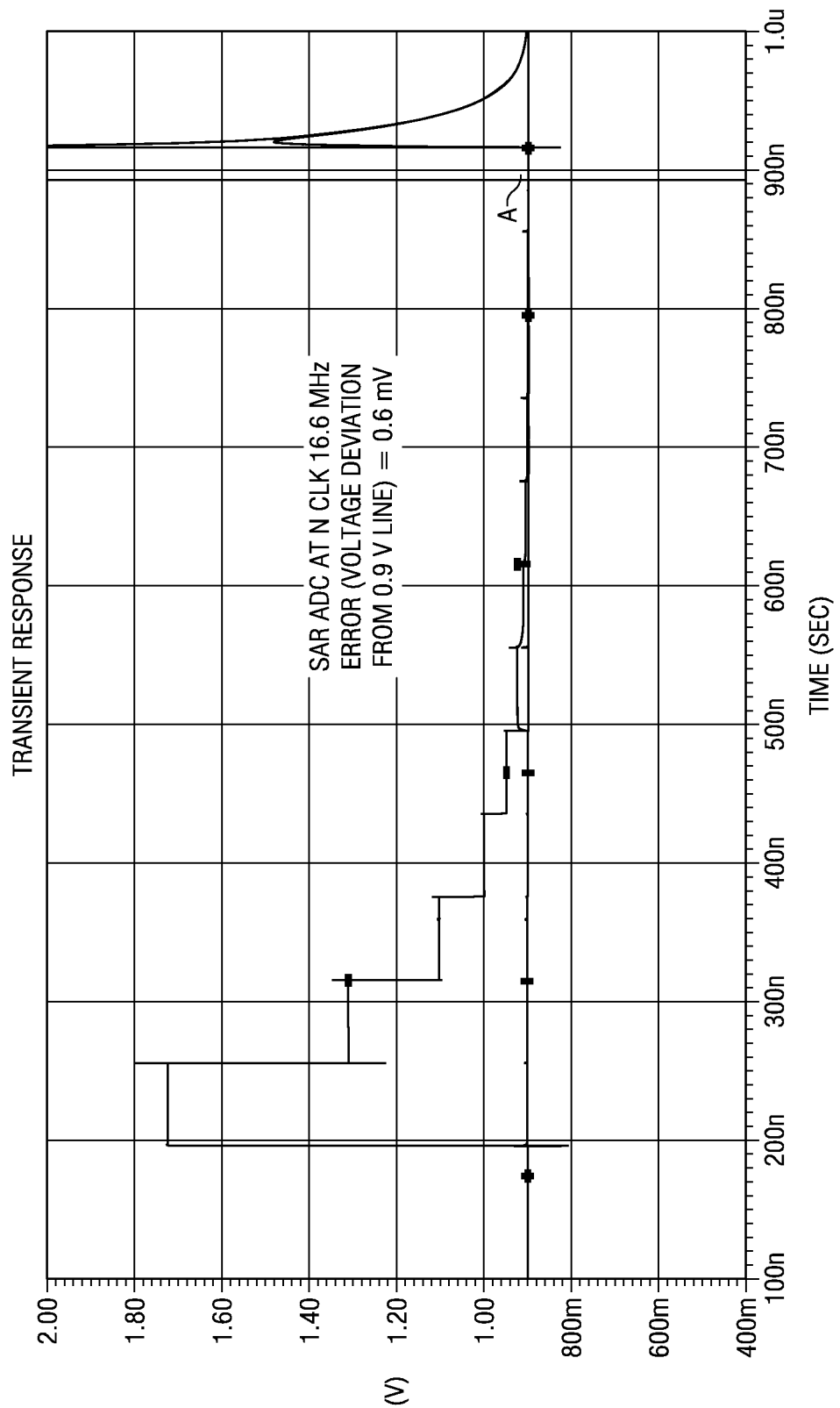

Reference is now made to FIGS. 8 and 9 that depict a graph of the transient response of a switched capacitor, successive approximation, analog to digital converter having a clocking system 46 with an N CLK clock rate of 4.16 MHz and 16.6 MHz, respectively. Note that with N CLK equal to approximately four, the error is approximately two millivolts while with N CLK equal to approximately sixteen, the error is approximately 0.6 millivolts, respectively, representing .x and y LSBs respectively.

Thus, specific systems and methods of correcting linearity errors induced by leakage current in a switched capacitor, successive approximation analog to digital converter have been disclosed. It should be apparent, however, to those skilled in the art that many more modifications besides those already described are possible without departing from the inventive concepts herein. The inventive subject matter, therefore, is not to be restricted except in the spirit of the disclosure. Moreover, in interpreting the disclosure, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

What is claimed is:

1. A successive approximation register analog to digital converter comprising:
   (a) a switched capacitor digital to analog converter having an output;
   (b) a comparator having an input sense node coupled to the output of the switched capacitor digital to analog converter;
   (c) at least one reset switch coupled between the input sense node on the comparator and a reference voltage; and,
   (d) a clocking system to provide timing to operate at lower sample rates wherein successive approximation cycles are clocked at the same clock pulse irrespective of the sample rate but wherein an end of conversion signal is delayed to mimic a slower sample rate.

2. A successive approximation register analog to digital converter of claim 1 further comprising a programmable register for programming sample rate reduction ratio.

3. A successive approximation register analog to digital converter of claim 1 wherein at least two reset switches are used for reading a differential voltage input to the comparator.

4. A successive approximation register analog to digital converter of claim 1 wherein the reference voltage is substantially one half of supply voltage.

5. An analog to digital converter comprising:
   (a) a switched capacitor digital to analog converter having an output;
   (b) a comparator having an input sense node;
   (c) at least one reset switch coupled between the input sense node on the comparator and a reference voltage; and
   (d) a clocking system having an end of conversion generator and a timing generator both having a first input coupled to a start of conversion signal, the end of conversion generator having a second input coupled to a system clock and an output, a clock multiplier having an input coupled to the system clock and an output coupled to a second input on the timing generator.

6. An analog to digital converter of claim 5 wherein the clock multiplier is a phase locked loop with a programmable register to adjust a multiplying factor N.

7. An analog to digital converter of claim 5 wherein at least two reset switches are used for reading a differential voltage input to input sense nodes to the comparator.

8. An analog to digital converter of claim 5 wherein the reference voltage is substantially one half of supply voltage.

9. A method of successive approximation conversion in an analog to digital converter having a comparator, at least one reset switch coupled to an input sense node on the comparator and a switched capacitor DAC, comprising steps of:
   (a) coupling the input sense node of the comparator to a reference voltage during periods of non-conversion;
   (b) using a constant clock frequency for switching the switched capacitor DAC and at the least one reset switch; and,
   (c) delaying issuance of an end of conversion signal to mimic a slower sample rate.

10. A method of claim 9 further comprising the step of multiplying a system clock by a multiplier N to produce the constant clock frequency.

11. A method of claim 10 wherein the step of multiplying further includes the step of programming a register with the multiplier N.

12. A method of claim 9 wherein at least two reset switches are used for reading a differential voltage input to the comparator.

13. A method of claim 9 wherein the reference voltage is substantially one half of supply voltage.

* * * * *